United States Patent [19]
Brain

[11] Patent Number: 6,048,445
[45] Date of Patent: Apr. 11, 2000

[54] METHOD OF FORMING A METAL LINE UTILIZING ELECTROPLATING

[75] Inventor: Ruth A. Brain, Portland, Oreg.

[73] Assignee: Intel Corporation, Santa Clara, Calif.

[21] Appl. No.: 09/047,291

[22] Filed: Mar. 24, 1998

[51] Int. Cl.[7] .................................................. C25D 5/02
[52] U.S. Cl. ....................... 205/118; 205/183; 205/186; 205/187
[58] Field of Search ................... 205/118, 183, 205/184, 186, 187

[56] References Cited

U.S. PATENT DOCUMENTS

| | | | |
|---|---|---|---|
| 4,062,720 | 12/1977 | Alcorn et al. | 156/643 |
| 4,751,172 | 6/1988 | Rodriguez et al. | 430/314 |
| 4,973,388 | 11/1990 | Francois et al. | 205/186 |
| 5,071,518 | 12/1991 | Pan | 205/122 |
| 5,679,234 | 10/1997 | Imamura | 205/123 |
| 5,685,968 | 11/1997 | Hayakawa et al. | 205/122 |

*Primary Examiner*—Kathryn Gorgos
*Assistant Examiner*—Wesley A. Nicolas
*Attorney, Agent, or Firm*—Blakely, Sokoloff, Taylor & Zafman LLP

[57] ABSTRACT

The invention relates to a method of forming a metal line. A photoresist layer is formed on a substrate and patterned so that a metal part on the substrate is exposed. A metal seed layer is then deposited over the photoresist layer utilizing a directional deposition technique. A portion of the metal seed layer is then removed. A metal plating is then formed on the metal seed layer utilizing a technique selected from the group consisting of electroplating and electroless plating. The photoresist layer is then removed.

30 Claims, 6 Drawing Sheets

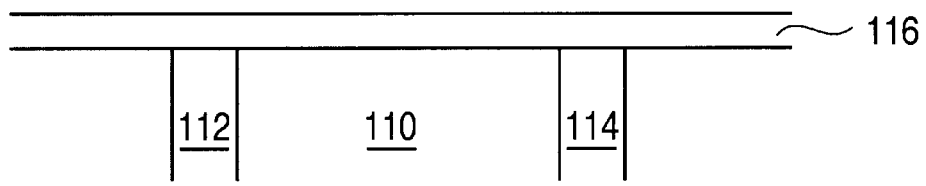
FIG. 1a
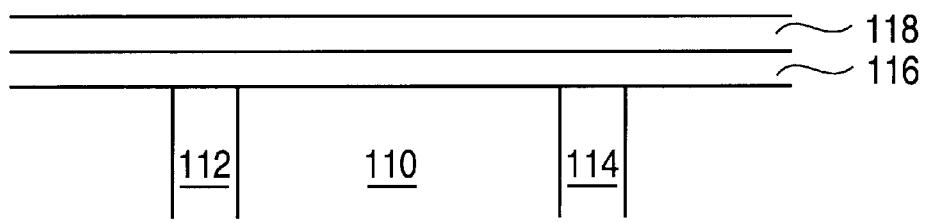
FIG. 1b
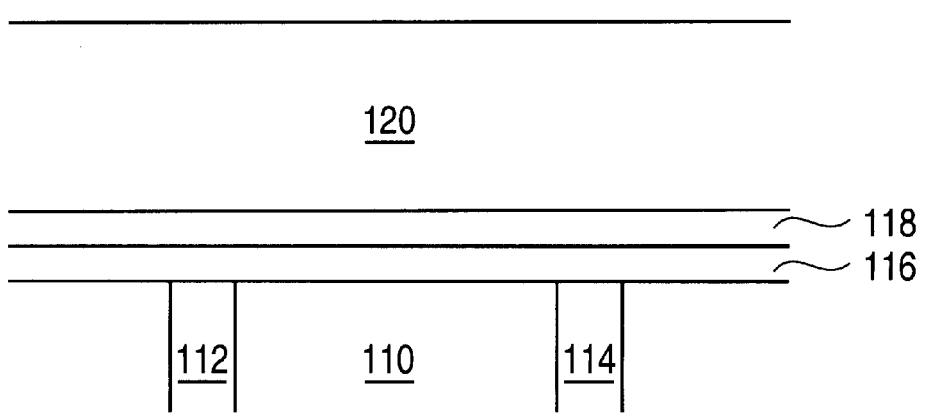
FIG. 1c
FIG. 1d

METHOD OF FORMING A METAL LINE UTILIZING ELECTROPLATING

BACKGROUND OF THE INVENTION

1). Field of the Invention

The present invention relates generally to a method of forming a metal line utilizing an electroplating or electroless plating technique.

2). Discussion of Related Art

A semiconductor chip usually comprises an integrated circuit of semiconductor electrical components which are connected to one another by a network of metal lines. The semiconductor chip is usually manufactured by forming the electrical components first. The electrical components include transistors, resistors, diodes, capacitors, etc. Each electrical component has one or more surfaces to which electrical connection has to be made. Various techniques exist for making contact with these surfaces. One such technique for making contact is by forming a via such as a tungsten plug via on each of the surfaces. The vias extend through a dielectric over the components and terminate at a surface of the dielectric. Opposing terminating ends of the vias are then interconnected with a network of metal lines to create an integrated circuit of electrical components. More vias are in certain instances formed on the metal lines and terminating ends of these vias are also interconnected in a similar manner.

A conventional technique which is used to form these metal lines is by electroplating. A seed layer of metal, typically copper, is located on the vias. A photoresist is then deposited on the metal seed layer, and patterned so that gaps are defined above the vias in the photoresist. More of the metal in the form of a metal plating is then deposited within the gap utilizing a bias voltage with the metal seed layer acting as a layer on which the metal easily forms. FIGS. 1a to 1i illustrate a conventional electroplating technique of the aforementioned kind, with some existing problems associated therewith.

FIG. 1a shows a substrate 110 having two tungsten vias 112 and 114. The vias 112 and 114 extend upwardly from electrical components or metal lines interconnecting electrical components and terminate at a surface of the substrate 110.

FIG. 1b shows the structure of FIG. 1a after an intermediate metal layer 116 is formed on the substrate 110 and the vias 112 and 114. The intermediate metal layer 116, as will be seen in FIG. 1f, serves as a conductor for supplying an electroplating voltage.

FIG. 1c shows the structure of FIG. 1b after a metal seed layer 118 is formed on the intermediate metal layer 116. The metal seed layer 118, as will be seen in FIG. 1f, serves as a layer on which an electroplated metal easily forms. Since the metal seed layer 118 interconnects the vias 112 and 114, the metal seed layer may have to be etched, as will be seen in FIG. 1h, to isolate at least some of the vias 112 and 114 from one another.

FIG. 1d shows the structure of FIG. 1d after a photoresist layer 120 is formed on the metal seed layer.

FIG. 1e shows the structure of FIG. 1d after the photoresist layer 120 has been patterned. The photoresist layer 120 is patterned so that a gap 122 is formed over the via 112 and a gap 124 is formed over the via 114.

FIG. 1f shows the structure of FIG. 1e after metal platings 126 and 128 are formed in the gaps 122 and 124 respectively. Each metal platings 126 or 128 is formed by submerging the structure of FIG. 1e within a metal solution and applying a bias voltage to the intermediate metal layer 116. The metal platings 126 or 128 then form on the seed layer 118. The technique of forming the metal platings 126 and 128 is known as "electroplating".

FIG. 1g shows the structure of FIG. 1f after removal of the photoresist layer 120. The photoresist is then stripped to leave the metal platings 126 and 128 intact.

FIG. 1h shows the structure of FIG. 1h after etching the metal seed layer 118. During etching of the metal seed layer the metal platings 126 and 128 recede by a distance 130 which is equal to a thickness 132 of the metal seed layer 118. Each metal plating 126 or 128 thus reduces in height by an amount which is equal to the thickness of the metal seed layer 118 and recudes in width by an amount which is equal to twice the thickness of the metal seed layer 118.

FIG. 1i shows the structure of FIG. 1h after the intermediate metal layer 116 is partially etched with a selective etch which only removes the material that the intermediate metal layer 116 is made of. The vias 112 and 114 are so isolated from one another to finalize the formation of a metal line 134 and 136 on each of the vias 112 and 114 respectively.

Thus what is required is a method of electroplating a metal line on a seed layer, wherein the seed layer is not subsequently etched with resulting damage to the metal line.

SUMMARY OF THE INVENTION

The invention relates to a method of forming a metal line. A photoresist is formed on a substrate and patterned so that a metal part on the substrate is exposed. A metal seed layer is then deposited over the photoresist utilizing a directional deposition technique. A portion of the metal seed layer is then removed. A metal plating is then formed on the metal seed layer utilizing a technique selected from the group consisting of electroplating and electroless plating. The photoresist is then removed.

BRIEF DESCRIPTION OF THE DRAWINGS

The invention is further described by way of example with reference to the accompanying drawings wherein:

FIG. 1a is a sectioned side view illustrating a substrate with two vias;

FIG. 1b is a sectional side view illustrating the structure of FIG. 1a after an intermediate metal layer is formed on the substrate and the vias;

FIG. 1c is a sectional side view illustrating the structure of FIG. 1b after a metal seed layer is formed on the intermediate metal layer;

FIG. 1d is a sectional side view illustrating the structure of FIG. 1c after a photoresist is formed on the metal seed layer;

DESCRIPTION OF THE INVENTION

In the following description, numerous specific details are set forth such as specific thicknesses, etch chemistry, etc., in order to provide a more thorough understanding of the present invention. It will be apparent, however, to one skilled in the art, that the present invention may be practiced without these specific details. In other instances, well known process steps have not been described in detail in order to avoid obscuring the present invention.

A method of forming a metal line is described. A substrate is provided which is formed with semiconductor electrical components such as transistors, resistors, diodes, capacitors etc. which are covered with a dielectric. Two or more tungsten vias have terminating ends in contact with the electrical components, extend through the dielectric and have opposing ends terminating at a surface of the dielectric. An intermediate metal layer is deposited on the substrate and the vias. A photoresist is deposited on the intermediate metal layer. The photoresist is patterned with gaps above the vias. A metal seed layer is deposited over the photoresist and within the gaps. The copper metal seed layer only partially fills each gap and is thicker on the intermediate metal layer than on sides of the photoresist. A portion of the metal seed layer is then removed. Removal of the portion of the metal seed layer electrically isolates a first volume of the metal seed layer on the photoresist from a second volume of the metal seed layer on the intermediate metal layer. Copper metal platings are then formed on the copper metal seed layer utilizing an electroplating or an electroless plating technique with a bias voltage applied to the intermediate metal layer. The metal platings form faster on the second volume than on the first volume because the first volume is electrically connected to the intermediate metal layer whereas the first and second volumes are electrically isolated from one another. The first volume of the metal seed layer and some of the metal plating on the second volume of the metal seed layer are then etched to expose the photoresist. The metal plating on the second volume is thicker than the first volume of the metal seed layer so that the photoresist is exposed before all of the metal plating on the second volume of the metal seed layer is removed. The photoresist is then etched away and the intermediate metal layer is etched with a selective etch that only attacks the intermediate metal layer without attacking the metal seed layer or the metal plating.

Figure 2A:
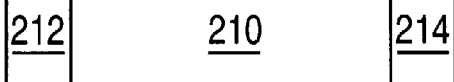
FIG. 2a is a sectioned side view illustrating a substrate with two vias.

FIG. 2a shows a substrate 210 having two metal vias 212 and 214 such as tungsten vias. The substrate 210 is formed with semiconductor electrical components (not shown) such as transistors, resistors, diodes, capacitors etc. The electrical components are covered with a dielectric. The vias 212 and 214 extend upwardly from the electrical components or metal lines interconnecting electrical components, through the dielectric, and terminate at a surface of the substrate 210.

Figure 2B:
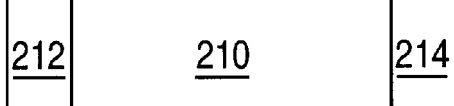
FIG. 2b is a sectioned side view of the structure of FIG. 2a after an intermediate metal layer is formed on the substrate and the vias.

FIG. 2b shows the structure of FIG. 2a after an intermediate metal layer 216 is deposited on the substrate 210 and on the vias 212 and 214. The purpose of the intermediate metal layer 216 is, as will be seen in FIG. 2g, to supply electrical voltage for plating. The intermediate metal layer is typically deposited in a blanket sputter deposition process. The intermediate metal layer 216 may be formed between 50 Å and 500 Å and may comprise any one of a number of conductive materials, such as tantalum nitride (TaN), tantalum (Ta), tantalum silicon nitride (TaSiN), titanium nitride (TiN), titanium silicon nitride ($Ti_xSi_yN_z$ where x, y and z are variable).

It could be noted at this stage that the intermediate metal layer 216 electrically connects the vias 212 and 214. As will be shown in FIG. 2j, the intermediate metal layer 216 will subsequently be etched to isolate the vias 212 and 214 electrically from one another.

Figure 2C:
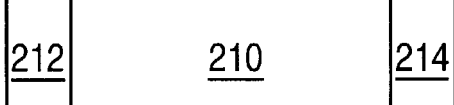
FIG. 2c is a sectioned side view of the structure of FIG. 2b after a photoresist is formed on the intermediate metal layer.
Figure 2D:
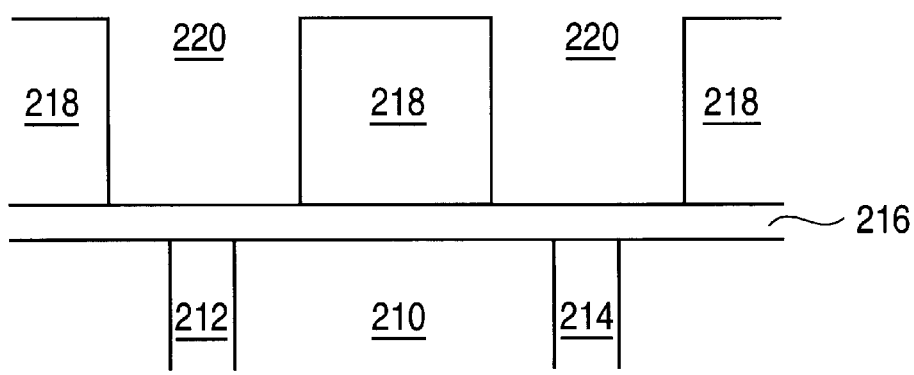
FIG. 2d is a sectioned side view of the structure of FIG. 2c after the photoresist is patterned with gaps.

FIG. 2c shows the structure of FIG. 2b after an electrically insulative layer in the form of a photoresist layer 218 is deposited on the intermediate metal layer 216. The photoresist layer 218 is deposited to at least the thickness of a required metal line. FIG. 2d shows the photoresist layer 218 after the photoresist is patterned. The photoresist after patterning has a number of gaps 220 which expose parts of the intermediate metal layer 216 in regions above the vias 212 and 214. Photoresist patterning techniques are known in the art and are not discussed in detail herein. Patterning of photoresists generally involves exposure of the photoresist to light which transmits through a mask. Areas of the photoresist are so exposed to light while others are not. The exposed areas change chemistry. A selective etch is then used which removes either the exposed areas or the non-exposed areas.

Figure 1E:
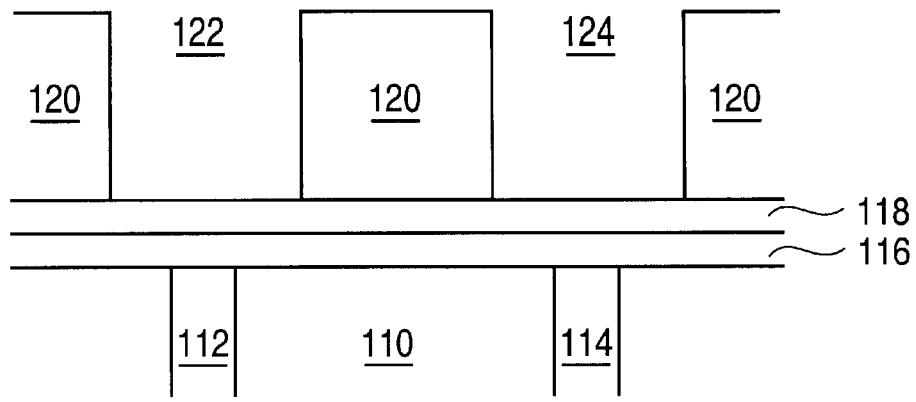
FIG. 1e is a sectional side view illustrating the structure of FIG. 1d after the photoresist is patterned with gaps.
Figure 1F:
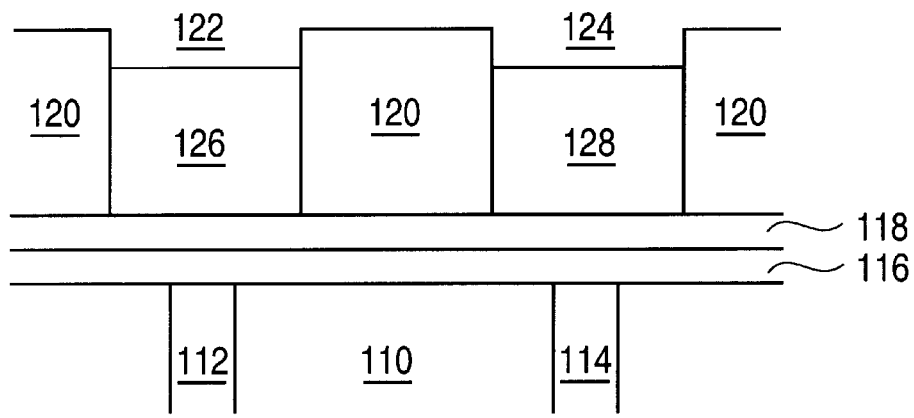
FIG. 1f is a sectional side view illustrating the structure of FIG. 1e after metal platings are formed within the gaps.
Figure 1G:
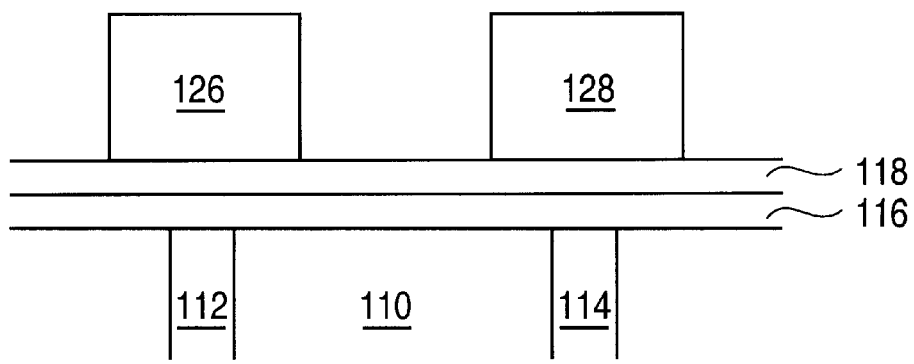
FIG. 1g is a sectional side view illustrating the structure of FIG. 1f after removal of the photoresist.

It could be noted at this stage that no metal seed layer need be formed before the photoresist layer 218 is formed, as opposed to the conventional method (see FIGS. 1c and 1d) which required the formation of a metal seed layer 216 before forming of the photoresist 120.

Figure 2E:
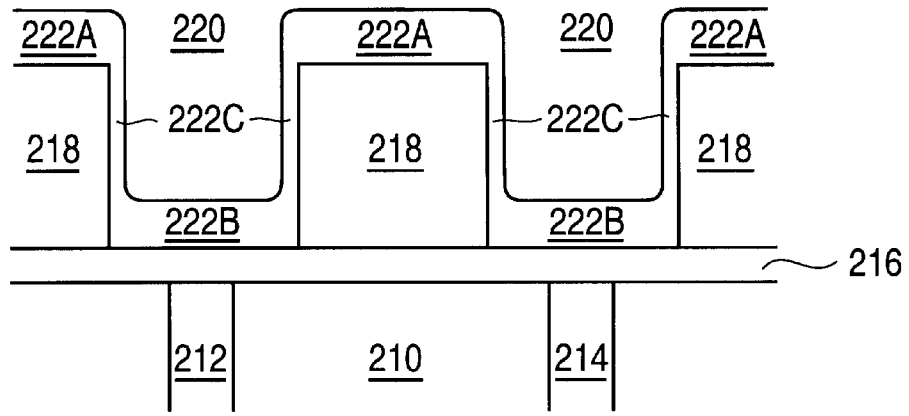
FIG. 2e is a sectioned side view of the structure of FIG. 2d after a metal seed layer is formed over the photoresist and within the gaps.

FIG. 2e shows the structure of FIG. 2d after a metal seed layer 222 is deposited over the photoresist layer 218 and within the gaps 220. The metal seed layer 222 may be a metal including copper, silver or gold. The material of the intermediate metal layer 216 therefore has to be conductive to the metal seed layer 222 forming thereon. The metal seed layer 222 is deposited utilizing a directional deposition technique. Directional deposition techniques which are known in the art include collimated sputtering, plasma enhanced chemical vapor deposition, and ionized physical vapor deposition with or without bias voltage. Directional deposition results in a metal seed layer 222 which is thicker in regions 222A on the photoresist and in regions 222B on the intermediate metal layer 216 in a base of each gap 220 than in regions 222C on sides of the photoresist. The metal seed layer 222 only partially fills each gap 220. The metal seed layer 222 may be between 100 Å and 1000 Å thick in the regions 222A or 222B, and less than 100 Å thick in the region 222C. The metal seed layer is a fraction as thick in region 222C than in the regions 222A or 222B, and is typically less than 20% as thick in the region 222C than in the regions 222A or 222B.

Figure 2F:
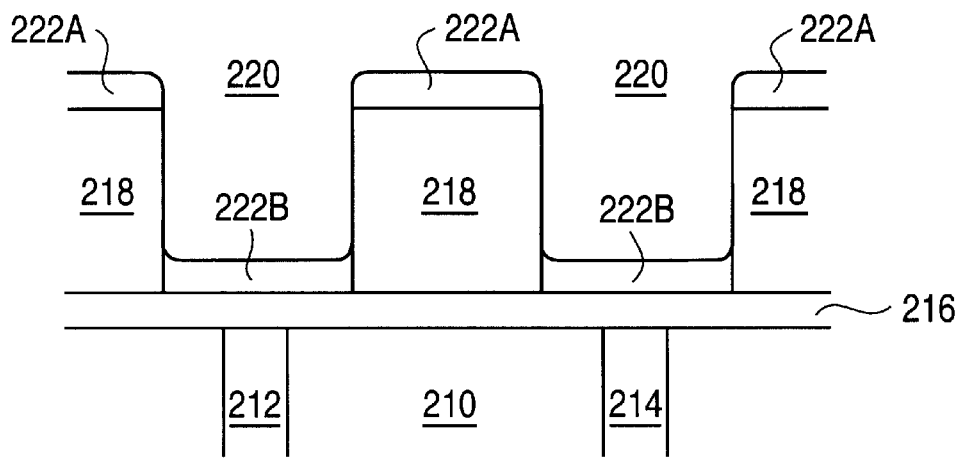
FIG. 2f is a sectioned side view of the structure of FIG. 2e after removal of some of the metal seed layer.

FIG. 2f shows the structure of FIG. 2e after removal of a portion of the metal seed layer 222. The removal rate of the metal seed layer 222 is more or less uniform so that the region 222C on the sides of the photoresist are completely removed before the metal seed layer 222 in the region 222A on the photoresist and in the region 222B on the intermediate metal layer 216 are completely removed. Removal of the metal seed layer in the region 222C on the sides of the photoresist results in the metal seed layer being separated into a first volume in the region 222A on the photoresist (hereinafter referred to as the "first volume 222A") and a second volume in the region 222B on the intermediate metal layer (hereinafter referred to as the "second volume 222B").

The portion of the metal seed layer 222 may be removed in any one of a variety of ways. In one embodiment the structure of FIG. 2e is submerged in an unsaturated solution and the portion left to dissolve in the solution. In another embodiment the structure of FIG. 2e is submerged in a saturated or an unsaturated solution and a bias voltage applied to the intermediate metal layer 216 until the portion is removed. The bias voltage is such that the intermediate metal layer acts as an anode. The latter technique is thus a "reverse electroplating" technique. In another embodiment the metal seed layer 222 is removed utilizing a reactive plasma etch that selectively removes the material of the metal seed layer. Such etchants are known in the art.

Figure 2G:
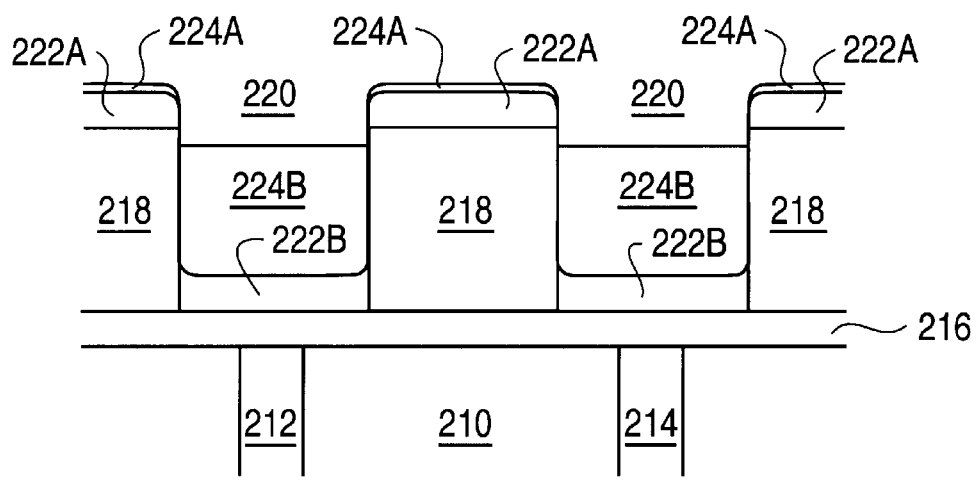
FIG. 2g is a sectioned side view of the structure of FIG. 2f after metal platings are formed on the metal seed layer.

FIG. 2g shows the structure of FIG. 2f after forming a metal plating 224A on the first volume 222A and a metal plating 224B on the second volume 222B. The metal platings 224A and 224B are formed utilizing an electroplating or an electroless plating technique wherein a bias voltage is applied to the intermediate metal layer 216, or exists between the intermediate metal layer 216 and a solution used for plating so that the intermediate metal layer acts as a plating cathode. The same solution may be used for carrying out the steps of FIGS. 2f and 2g. Because the second volume 222B is in electric contact with the intermediate metal layer 216 and the first volume 222A is electrically isolated from both the second volume 222B and the intermediate metal layer 216, a higher bias voltage exists at the second volume 222B than at the first volume 222A. The higher bias voltage results in the metal plating 224B forming faster on the second volume 222B than the metal plating 224A on the first volume 222A. The metal plating 224B may form on the second volume 222B to a thickness of between 0.3 μm and 2 μm. The metal plating 224A may form on the first volume 222A to a thickness of less than 1000 Å, although it should be understood that it may be possible that no metal plating forms on the first volume 222A.

The plating may be done with a solution of copper sulfate (resulting in a copper plating), silver nitrate (resulting in a silver plating) or gold cyanide (resulting in a gold plating). Although in the present embodiment, the metal plating 224B on the second volume 222B almost fills the gap 222A, it should be understood that an embodiment may be envisaged wherein the metal plating 224B merges with the first volume 222A.

The material of the metal platings 224 may be the same as the material of the metal seed layer 222. Although FIG. 2g shows a line between the metal platings 224 and the metal seed layer 222 it should be understood that the line is shown for illustrative purposes only and that, in the embodiment where the same material is used, a homogeneous transition could exist between the two layers.

Figure 2H:
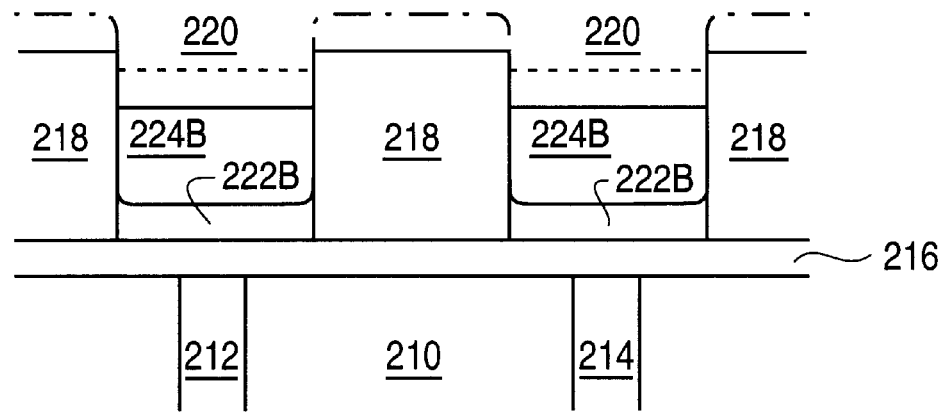
FIG. 2h is a sectioned side view of the structure of FIG. 2g after an etching step.

FIG. 2h shows the structure of FIG. 2g after an etching step. Etching is carried out until the first volume 222A is removed, thus exposing the photoresist layer 218. The first volume 222A and the metal plating 224A together are much thinner than the second volume 222B and the metal plating 222B together so that, after exposure of the photoresist, a substantial amount of metal remains within each gap 220.

Figure 2I:
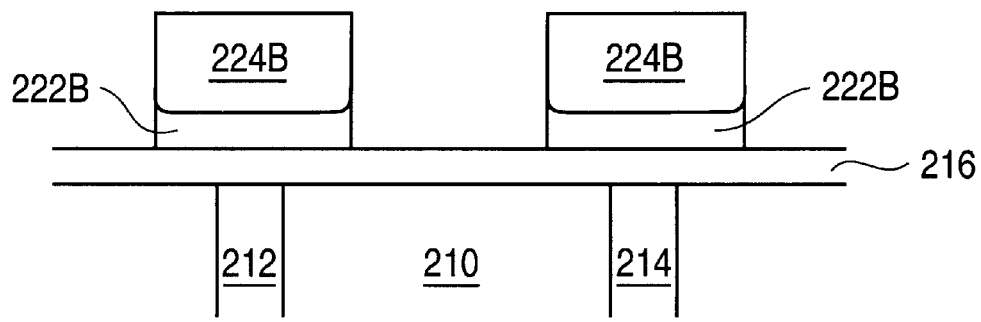
FIG. 2i is a sectioned side view of the structure of FIG. 2g after removal of the photoresist.

FIG. 2i shows the structure of FIG. 2h after removal of the photoresist layer 218. The photoresist layer 218 is stripped using known photolithographic techniques. Such etchants are known in the art.

Figure 1H:
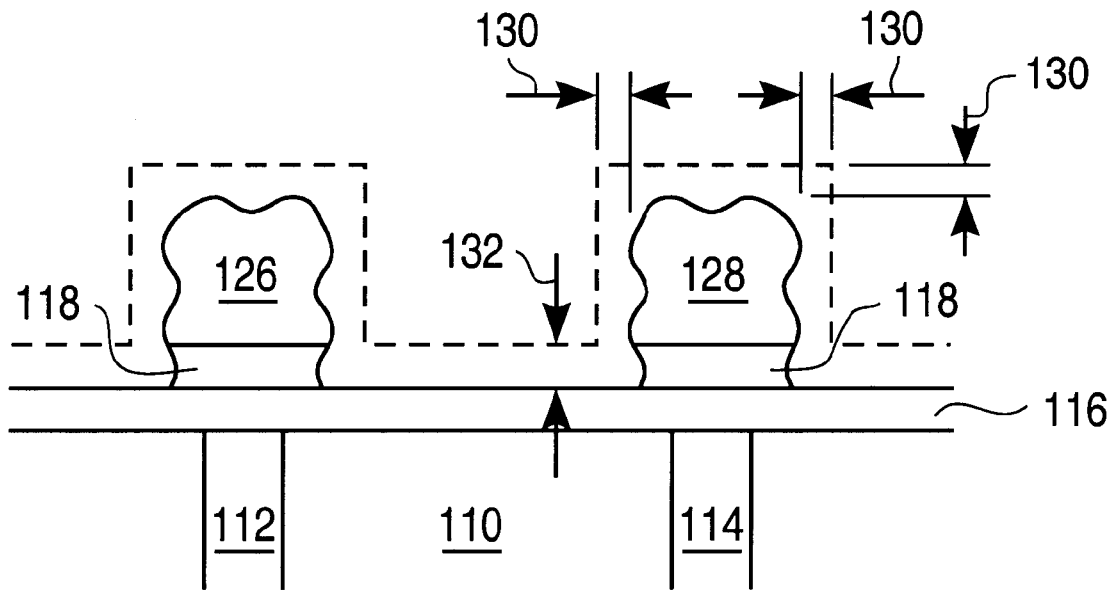
FIG. 1h is a sectional side view illustrating the structure of FIG. 1g after etching the metal seed layer.
Figure 1I:
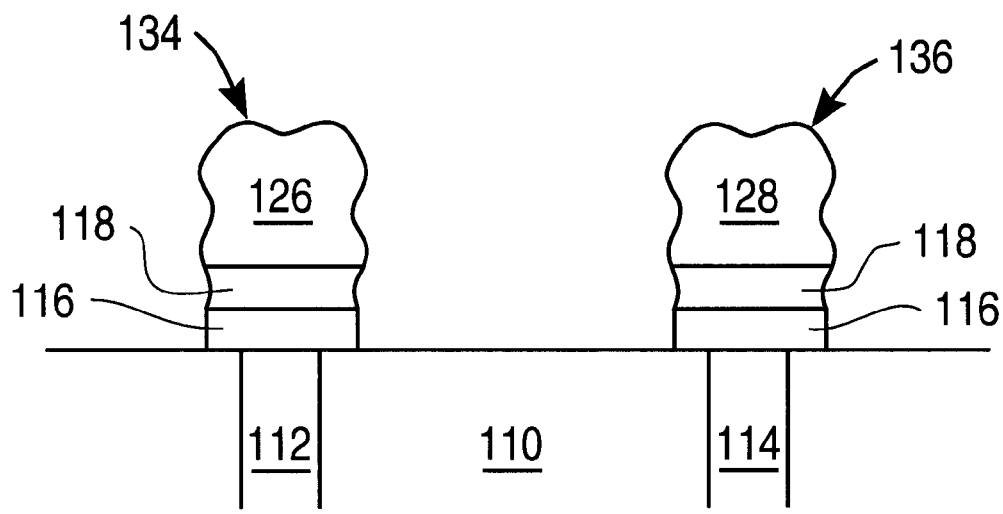
FIG. 1i is a sectional side view illustrating the structure of FIG. 1h after etching the intermediate metal layer.

It should be noted at this stage that no etching of the metal seed layer 222 is required after removal of the photoresist 218, as opposed to the conventional method (see FIG. 1h) wherein the metal seed layer 118 is etched with resulting damage to the metal plating 128.

Figure 2J:
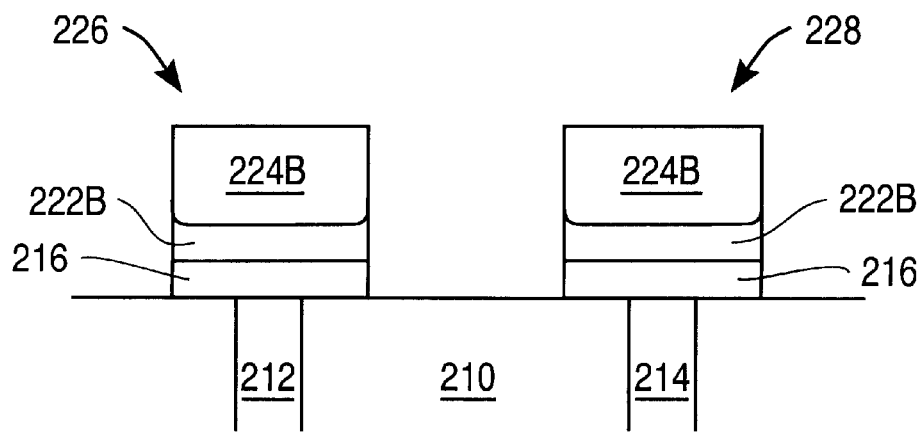
FIG. 2j is a sectioned side view of the structure of FIG. 2i after etching the intermediate metal layer.

FIG. 2j shows the structure of FIG. 2j after selective etching of the intermediate metal layer 216 without attacking the metal plating 224B or the second volume 222B. Etching of the intermediate metal layer 216 splits the intermediate metal layer 216 in two portions, one in contact with the via 212 and the other in contact with the via 214. The vias 212 and 214 are thus electrically isolated from one another, which finalizes the formation of metal lines 226 and 228 on the via 212 and the via 214, respectively.

Metal lines 226 and 228 are thus formed on the vias 212 and 214 utilizing a plating technique and without subsequent etching of the seed layer 222 with resulting damage to the metal lines.

In one example a copper metal seed layer is deposited. A copper solution is then used for purposes of plating the copper metal lines. The barrier layer may be tantalum, tantalum nitride, tantalum silicon nitride, titanium nitride or titanium silicon nitride.

What is claimed:

1. A method of forming a metal line, comprising the steps of:

forming an electrically insulative layer of material on a substrate;

patterning the electrically insulative layer of material to form a gap in the electrically insulative layer of material so that a metal part on the substrate is exposed in a base of the gap;

depositing a metal seed layer on the electrically insulative layer of material utilizing a directional deposition technique, the metal seed layer being deposited over the electrically insulative layer, within the gap on the metal part, and on sides of the gap;

removing a portion of the metal seed layer so as to separate a volume of the metal seed layer on the metal part from a volume of the metal seed layer on the electrically insulative layer; and forming a metal plating on the volume of the metal seed layer on the metal part utilizing electroplating.

2. The method of claim 1 wherein the electrically insulative layer material is a photoresist layer, and further comprises the step of removing the photoresist layer.

3. The method of claim 1 wherein the metal seed layer is deposited utilizing a technique selected from the group consisting of collimated sputtering, plasma enhanced chemical vapor deposition, ionized physical vapor deposition with voltage bias and ionized physical vapor deposition without voltage bias.

4. The method of claim 1 wherein the metal seed layer is thicker on the metal part than on a sides of the gap.

5. The method of claim 1 wherein the metal seed layer only partially fills the gap which is patterned in the electrically insulative layer of material.

6. The method of claim 1 wherein the metal seed layer has a thickness on sides of the gap, and a thickness on the metal part, wherein the thickness on the sides of the gap is less than 20% the thickness on the metal part.

7. The method of claim 1 wherein the metal seed layer is selected from the group consisting of copper, silver and gold.

8. The method of claim 1 wherein the portion of the metal seed layer is dissolved.

9. The method of claim 8 wherein the portion of the metal seed layer is dissolved in an unsaturated solution.

10. The method of claim 8 wherein the portion of the metal seed layer is removed utilizing a reactive plasma etch that selectively removes the material of the metal seed layer.

11. The method of claim 8 wherein the metal seed layer is dissolved in a saturated solution.

12. The method of claim 1 wherein a bias voltage is supplied to the metal part to form the metal plating.

13. The method of claim 1 wherein the metal seed layer and the metal plating are of the same material.

14. The method of claim 1 wherein the metal plating forms faster on the metal seed layer on the metal part than on the metal seed layer on the electrically insulative layer of material.

15. The method of claim 14 wherein the metal plating does not form on the metal seed layer on the electrically insulative layer of material.

16. The method of claim 1 wherein the metal plating forms on the metal seed layer on the metal part to a thickness of between 0.3 $\mu$m and 2.0 $\mu$m.

17. The method of claim 1 wherein the metal plating forms on the metal seed layer on the electrically insulative layer of material to a thickness of less than 1000 Å.

18. The method of claim 1 wherein the electroplating technique utilizes a solution selected from the group consisting of copper sulfate, silver nitrate and gold cyanide.

19. The method of claim 1 wherein the electrically insulative layer of material is removed with a selective etch.

20. The method of claim 1 which includes the step of forming an intermediate metal layer between the substrate and the electrically insulative layer of material, wherein the metal part is a part of the intermediate layer.

21. The method of claim 20 wherein the intermediate metal layer is of a material selected from the group consisting of: tantalum, tantalum nitride, tantalum silicon nitride, titanium nitride and titanium silicon nitride.

22. The method of claim 20 which includes the step of at least partially removing the intermediate metal layer with a selective etch after removal of the electrically insulative layer of material.

23. The method of claim 22 wherein a plurality of metal lines are formed and wherein removal of the intermediate layer electrically isolates the metal lines from one another.

24. The method of claim 1 which includes the step of removing a portion of the metal seed layer.

25. The method of claim 24 wherein removal of the portion of the metal plating exposes the electrically insulative layer of material.

26. The method of claim 24 wherein the portion of the metal plating is removed with an etchant.

27. The method of claim 24 wherein, after removal of the portion of the metal plating, another portion of the metal plating remains electrically connected to the metal part.

28. A method of forming a metal line, comprising the steps of:

forming a photoresist layer on a substrate;

patterning the photoresist layer to form a gap in the electrically insulative layer so that a metal part on the substrate is exposed in a base of the gap;

depositing a copper metal seed layer on the photoresist layer utilizing a directional deposition technique, the metal seed layer being deposited over the electrically insulative layer, within the gap on the metal part, and on sides of the gap;

removing a portion of the copper metal seed layer so as to separate a volume of the metal seed layer on the copper metal part from a volume of the copper metal seed layer on the electrically insulative layer; and forming a copper metal plating on the volume of the copper metal seed layer utilizing electroplating.

29. The method of claim 28 wherein the metal plating does not form on the first volume of the metal seed layer.

30. A method of forming a metal line, comprising the steps of:

forming an electrically insulative layer of material on a substrate;

patterning the electrically insulative layer of material to form a gap in the electrically insulative layer so that a gap is formed in the electrically insulative layer of material with a metal part on the substrate exposed in a base of the gap;

depositing a metal seed layer over the electrically insulative layer of material and within the gap utilizing a directional deposition technique, wherein the metal seed layer only partially fills the gap and is thicker on the metal part than on a side of the gap;

removing a portion of the metal seed layer so that a first volume of the metal seed layer on the electrically insulative layer of material is electrically isolated from a second volume of the metal seed layer on the metal part;

forming a metal plating on the metal seed layer utilizing electroplating, wherein the metal plating forms at a faster rate on the second volume than on the first volume of the metal seed layer;

removing the first volume of the metal seed layer to expose the electrically insulative layer of material without removing all of the amount of metal on the second volume of the metal seed layer.

* * * * *